(12) United States Patent
Ahmed et al.

(10) Patent No.: US 9,225,291 B2
(45) Date of Patent: Dec. 29, 2015

(54) ADAPTIVE ADJUSTMENT OF POWER SPLITTER (71) Applicants: Abdulrhman M. S. Ahmed, Gilbert, AZ (US); Paul R. Hart, Phoenix, AZ (US); Joseph Staudinger, Gilbert, AZ (US)

(72) Inventors: Abdulrhman M. S. Ahmed, Gilbert, AZ (US); Paul R. Hart, Phoenix, AZ (US); Joseph Staudinger, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 49 days.

(21) Appl. No.: 14/066,601

(22) Filed: Oct. 29, 2013

(65) Prior Publication Data

US 2015/0116039 A1 Apr. 30, 2015

(51) Int. Cl.
H03F 3/68 (2006.01)
H03F 1/02 (2006.01)
H03F 3/21 (2006.01)

(52) U.S. Cl.
CPC ............ *H03F 1/0233* (2013.01); *H03F 1/0288* (2013.01); *H03F 3/211* (2013.01); *H03F 3/68* (2013.01); *H03F 2200/504* (2013.01); *H03F 2203/21121* (2013.01)

(58) Field of Classification Search
CPC ................................. H03F 3/68; H03F 1/0288
USPC ........................................ 330/84, 124 R, 295
See application file for complete search history.

(56) References Cited

U.S. PATENT DOCUMENTS

| | | | |
|---|---|---|---|
| 2,210,028 A | 8/1940 | Doherty | |
| 3,613,028 A | 10/1971 | Seidel | |
| 3,671,885 A | 6/1972 | Pennypacker | |
| 3,982,244 A | 9/1976 | Ward et al. | |
| 4,002,971 A | 1/1977 | Rast et al. | |
| 4,048,568 A | 9/1977 | Rast et al. | |
| 4,477,781 A | 10/1984 | Reuss, Jr. et al. | |
| 4,792,805 A | 12/1988 | Miglia | |
| 4,975,604 A | 12/1990 | Barta | |
| 4,987,378 A | 1/1991 | Eggleston et al. | |
| 5,015,965 A | 5/1991 | Katz et al. | |
| 5,148,062 A | 9/1992 | Goldfarb | |
| 5,317,288 A | 5/1994 | Yung et al. | |

(Continued)

FOREIGN PATENT DOCUMENTS

| | | |
|---|---|---|
| EP | 2017956 A1 | 1/2009 |
| EP | 2093879 A1 | 8/2009 |

(Continued)

OTHER PUBLICATIONS

U.S. Appl. No. 13/656,551, filed Oct. 19, 2012, entitled "Amplifier Calibration".

(Continued)

*Primary Examiner* — Steven J Mottola
(74) *Attorney, Agent, or Firm* — Quarles & Brady LLP (57) ABSTRACT

A device includes a power splitter configured to couple to an amplifier having a first path and a second path. The device includes a controller coupled to first and second variable attenuators and first and second adjustable phase shifters. The controller is configured to monitor a phase shift and an output power of each of the first path and second path of the amplifier, and adjust at least one of the first and second variable attenuators and the first and second adjustable phase shifters based upon the phase shift and the output power of each of the first path and second path of the amplifier to modify an input signal to the first path or the second path of the amplifier.

20 Claims, 3 Drawing Sheets

(56) References Cited

U.S. PATENT DOCUMENTS

| | | | |
|---|---|---|---|
| 5,349,364 | A | 9/1994 | Bryanos et al. |
| 5,444,418 | A | 8/1995 | Mitzlaff |
| 5,469,129 | A | 11/1995 | Dydyk |
| 5,576,660 | A | 11/1996 | Pouysegure et al. |
| 5,594,385 | A | 1/1997 | Anvari |
| 5,884,143 | A | 3/1999 | Wolkstein et al. |
| 5,929,804 | A | 7/1999 | Jones et al. |
| 5,969,572 | A | 10/1999 | Jeong et al. |
| 5,986,500 | A | 11/1999 | Park et al. |
| 6,006,111 | A * | 12/1999 | Rowland ............... 455/561 |
| 6,041,077 | A | 3/2000 | Clark et al. |
| 6,070,090 | A | 5/2000 | Feuerstein |
| 6,111,462 | A | 8/2000 | Mucenieks et al. |
| 6,163,210 | A | 12/2000 | Fukuchi |
| 6,208,204 | B1 | 3/2001 | Suzuki et al. |
| 6,232,838 | B1 | 5/2001 | Sugimoto |
| 6,236,286 | B1 | 5/2001 | Hoffmann et al. |
| 6,255,908 | B1 | 7/2001 | Ghannouchi et al. |
| 6,320,464 | B1 | 11/2001 | Suzuki et al. |
| 6,356,149 | B1 | 3/2002 | Stengel et al. |
| 6,515,544 | B1 | 2/2003 | Suzuki et al. |
| 6,972,621 | B2 | 12/2005 | Matsuyoshi et al. |
| 7,071,775 | B2 | 7/2006 | Gailus et al. |
| 7,078,976 | B2 | 7/2006 | Blednov |
| 7,098,859 | B2 | 8/2006 | Shimawaki et al. |
| 7,129,778 | B2 | 10/2006 | Robinson |
| 7,167,693 | B2 | 1/2007 | Bachman, II et al. |
| 7,205,817 | B1 | 4/2007 | Huang et al. |
| 7,239,218 | B2 | 7/2007 | Nakamura |
| 7,402,821 | B2 | 7/2008 | Berhardt |
| 7,427,895 | B1 | 9/2008 | Okubo et al. |
| 7,525,395 | B2 | 4/2009 | Hwang et al. |
| 7,598,805 | B2 | 10/2009 | Staudinger et al. |
| 7,626,455 | B2 | 12/2009 | Ito et al. |
| 7,680,467 | B2 | 3/2010 | Ishigami |
| 7,683,828 | B2 | 3/2010 | Stagliano et al. |
| 7,786,822 | B2 | 8/2010 | Vice |
| 7,813,766 | B1 | 10/2010 | Lam |
| 7,928,817 | B2 | 4/2011 | Atsumo |
| 8,035,444 | B2 | 10/2011 | Okubo |
| 8,195,118 | B2 | 6/2012 | Warnick |
| 8,354,882 | B2 | 1/2013 | Blednov |
| 8,493,143 | B2 | 7/2013 | Khilia et al. |
| 8,514,007 | B1 | 8/2013 | Ahmed et al. |
| 8,606,206 | B1 | 12/2013 | Lam et al. |
| 8,674,746 | B1 | 3/2014 | Staudinger et al. |
| 8,710,924 | B2 | 4/2014 | van der Zanden et al. |
| 8,712,466 | B2 | 4/2014 | Martineau et al. |
| 8,736,347 | B2 | 5/2014 | Ahmed et al. |
| 8,736,365 | B2 | 5/2014 | Correa et al. |
| 8,760,261 | B2 | 6/2014 | Panchalan |
| 8,816,767 | B2 | 8/2014 | Ahmed et al. |
| 8,957,734 | B2 | 2/2015 | Ahmed et al. |
| 8,988,165 | B2 | 3/2015 | Staudinger et al. |
| 2006/0044060 | A1 | 3/2006 | Shiikuma |
| 2008/0039024 | A1 | 2/2008 | Ikeda et al. |
| 2008/0111622 | A1 | 5/2008 | Sperlich et al. |
| 2008/0238544 | A1 | 10/2008 | Morris et al. |
| 2009/0167434 | A1 | 7/2009 | Elmala |
| 2009/0206928 | A1 | 8/2009 | Bowles et al. |
| 2010/0026387 | A1 | 2/2010 | Blednov |
| 2010/0156528 | A1 | 6/2010 | Couchman et al. |
| 2010/0227599 | A1 | 9/2010 | Vella-Coleiro et al. |
| 2012/0224653 | A1 | 9/2012 | Lozhkin |
| 2012/0294387 | A1 | 11/2012 | Ghannouchi et al. |
| 2012/0299765 | A1 | 11/2012 | Huang |
| 2013/0241640 | A1* | 9/2013 | Lin et al. ............... 330/124 R |
| 2014/0077874 | A1 | 3/2014 | Ahmed et al. |
| 2014/0253248 | A1 | 9/2014 | Ahmed et al. |

FOREIGN PATENT DOCUMENTS

| | | |
|---|---|---|
| EP | 2 521 257 A1 | 7/2012 |
| EP | 2621085 A2 | 7/2013 |
| JP | 2003209447 A | 7/2003 |
| JP | 2005117599 A | 4/2005 |
| JP | 2010273212 A | 12/2010 |
| SU | 1737577 A1 | 5/1992 |
| WO | 2013006943 A1 | 1/2013 |

OTHER PUBLICATIONS

Non-Final Rejection mailed May 20, 2015 for U.S. Appl. No. 14/086,520 7 pages.

Chen, Jiashu et al., "Design and Analysis of a Stage-Scaled Distributed Power Amplifier," IEEE Transactions on Microwave Theory and Techniques, vol. 59, No. 5, pp. 1274-1283, May 2011.

Darraji, Ramzi et al., A Dual-Input Digitally Driven Doherty Amplifier Architecture for Performance Enhancement of Doherty Transmitters, IEEE Transactions on Microwave Theory and Techniques, vol. 59, No. 5, pp. 1284-1293, May 2011.

Hsu, Sen-Kuei et al., "A Novel Compact Forward-Wave Directional Coupler Design Using Periodical Patterned Ground Structure," IEEE Transactions on Microwave Theory and Techniques, vol. 59, No. 5, pp. 1249-1257, May 2011.

Lane, A.A. "GaAs MMIC Phase Shifters for Pahse Arrays;IEEE Colloquim on Solid State Components for Radar"; pp. 3/1-3/5; 1988.

Mortazy, Ebrahim et al., "Mode Coupling Between Substrate Integrated Waveguide and Coplanar Waveguide for Traveling-Wave Electrooptical Modulator," IEEE Transactions on Microwave Theory and Techniques, vol. 59, No. 5, pp. 1258-1264, May 2011.

Sazegar, Mohsen et al., "Low-Cost Phased-Array Antenna Using Compact Tunable Phase Shifters Based on Ferroelectric Ceramics," IEEE Transactions on Microwave Theory and Techniques, vol. 59, No. 5, pp. 1265-1273, May 2011.

Zawrotny, K. et al., "C-Band 4-Bit Phase Shifter MMIC"; Microwaves, Radar and Wireless Communications 2008; Mikon 2008 17th international conference; 4 pages.

Notice of Allowance mailed Oct. 29, 2013 for U.S. Appl. No. 13/653,155 9 pages.

Notice of Allowance mailed Oct. 9, 2013 for U.S. Appl. No. 13/656,551 10 pages.

Notice of Allowance mailed Apr. 16, 2014 for U.S. Appl. No. 14/152,081 8 pages.

Notice of Allowance mailed Oct. 3, 2014 for U.S. Appl. No. 14/464,270 8 pages.

Non-Final Office Action mailed Dec. 23, 2013 for U.S. Appl. No. 13/360,119 8 pages.

Notice of Allowance mailed Nov. 20, 2014 for U.S. Appl. No. 13/360,119 7 pages.

Non-Final Rejection mailed Feb. 7, 2013 for U.S. Appl. No. 13/360,473 7 pages.

Notice of Allowance mailed May 16, 2013 for U.S. Appl. No. 13/360,473 9 pages.

Non-Final Rejection mailed Sep. 10, 2013 for U.S. Appl. No. 13/959,254 10 pages.

Notice of Allowance mailed Jan. 7, 2014 for U.S. Appl. No. 13/959,254 7 pages.

Non-Final Rejection mailed Oct. 9, 2014 for U.S. Appl. No. 14/287,139 12 pages.

Notice of Allowance mailed Mar. 18, 2015 for U.S. Appl. No. 14/287,139 8 pages.

EP Application 13151802.9 Partial Search Report, dated Sep. 26, 2014, pp. 1-8.

EP Application 13151802.9 Search Report, dated Jan. 13, 2015, 13 pages.

Final Rejection mailed Oct. 15, 2014 for U.S. Appl. No. 14/086,520 5 pages.

Non-Final Rejection mailed Jul. 1, 2014 for U.S. Appl. No. 14/086,520 9 pages.

Notice of Allowance mailed Apr. 2, 2015 for U.S. Appl. No. 14/086,520 9 pages.

Notice of Allowance mailed Apr. 28, 2015 for U.S. Appl. No. 14/287,139 10 pages.

EP Application No. 14189701.7 Extended European Search Report, dated Sep. 14, 2015, 13 pages.

* cited by examiner

ADAPTIVE ADJUSTMENT OF POWER SPLITTER

FIELD OF THE INVENTION

Embodiments of the inventive subject matter relate to an amplifier and more specifically to an amplifier having an adjustable power splitter and phase and power detectors.

BACKGROUND OF THE INVENTION

Doherty amplifiers are amplifiers commonly used in wireless communication systems. Today, for example, Doherty amplifiers are used increasingly in base stations that enable the operation of wireless communications networks. Doherty amplifiers are suitable for use in such applications because the amplifiers include separate amplification paths—typically a carrier path and a peaking path. The two paths are configured to operate at different classes. More particularly, the carrier amplification path typically operates in a class AB mode and the peaking amplification path is biased such that it operates in a class C mode. This enables improved power-added efficiency and linearity of the amplifier, as compared to a balanced amplifier, at the power levels commonly encountered in wireless communications applications.

Generally, a power splitter supplies the input signals to each amplification path in the Doherty amplifier. Power splitters or signal splitters or dividers are known and used, as the name suggests, to divide or split a signal into two or more signals with known, predetermined amplitude and phase relationships.

In a Doherty amplifier, it is generally desirable that the amplifier exhibit constant carrier compression over a range of input signals. Additionally, it is desirable to match the amplitude and phase constituents of the signals presented to the carrier and peaking amplifiers such that the desired load modulation is achieved and the output signals of the carrier and peaking amplifier combine as expected at the amplifier's output.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

In overview, the present disclosure describes embodiments of the inventive subject matter that relate to an amplifier and more specifically to an amplifier having an adjustable power splitter and phase and power detectors.

In the present disclosure, embodiments of the system are described in conjunction with a Doherty amplifier, though it should be appreciated that in the present disclosure the Doherty amplifier may be replaced by an alternative dual-path or multiple-path amplifier (e.g., an amplifier with more than two amplification paths), in various embodiments.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Doherty amplifiers are used in a number of wireless applications, as the amplifiers enable high efficiency over a wide output power range and can achieve a desired linearity using various linearization schemes. In many implementations, Doherty amplifiers include two amplifiers—a carrier or main amplifier, and a peaking amplifier. In a symmetric Doherty amplifier, the carrier and peaking amplifiers are the same size. Symmetric Doherty amplifiers are commonly used today, but asymmetric Doherty amplifiers that employ a peaking amplifier that is larger than the carrier amplifier offer the potential for additional efficiency improvements.

In a Doherty amplifier, an input signal is split at an input or power splitter between the main and peaking amplification paths or circuits. The split signals are then separately amplified by the carrier and peaking amplifiers of the Doherty amplifier and combined at an output stage. When combining the outputs of the carrier and peaking amplifiers, it may be desired to make minor adjustments in the phase and amplitude or attenuation of the Doherty device's input splitter to provide optimal balancing between the outputs of each path of the amplifier. To facilitate this adjustment, an embodiment of an amplifier (e.g., a Doherty amplifier) may include an adjustable power divider or splitter that can be used to fine-tune the configuration of the input signals to each of multiple paths (e.g., to both the carrier and peaking amplifiers). An embodiment of an amplifier (e.g., a Doherty amplifier) may also include an adjustable phase delay and/or an amplitude adjustment configured to selectively modify the phase shift and/or amplitude one of one or more paths of the amplifier.

Figure 1:
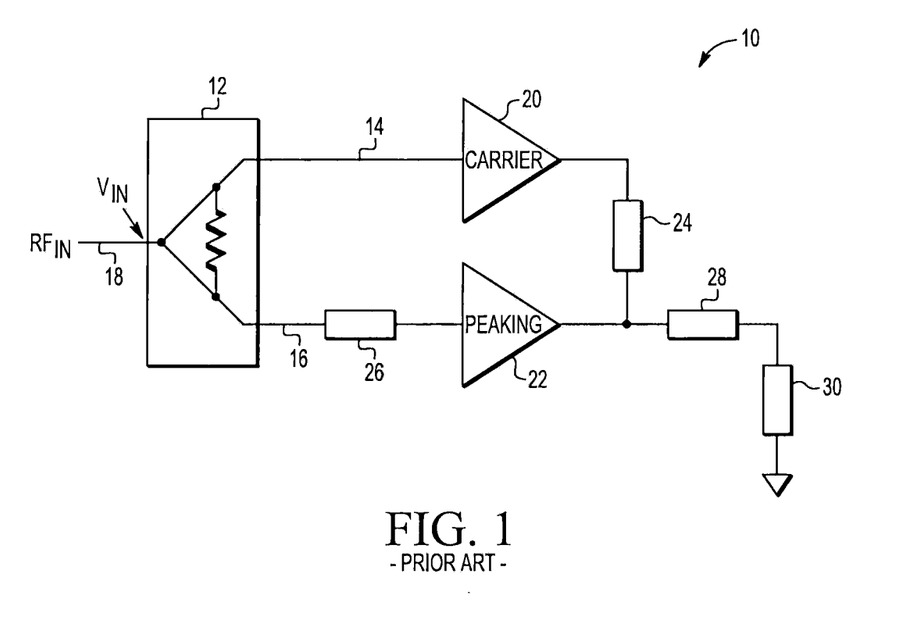
FIG. 1 shows a conventional Doherty amplifier lineup including a main or carrier path and a peaking path.

FIG. 1 shows a conventional Doherty amplifier lineup 10 including a main or carrier path and a peaking path. In FIG. 1 as shown, a power splitter 12 is coupled to a main or carrier path 14 and a peaking path 16 of Doherty amplifier 10. The power splitter 12 is configured to divide an input signal (e.g., radio frequency in (RFIN)) into multiple signals that are each transmitted along different amplification paths. Each amplification path may include a number of attenuators, phase shifters, and/or amplifiers. In FIG. 1, the power splitter 12 generates two output signals.

In one implementation, the power splitter 12 can include a power divider with an input 18 for receiving the input radio frequency signal, and first and second divider outputs. When connected to a symmetrical Doherty amplifier, the power splitter 12 may divide or split an input signal received at the input 18 into two signals that are very similar with, in some embodiments, equal power. In other cases, though, the power splitter 12 may output signals having unequal power.

The outputs of the power splitter 12 are connected to main or carrier amplifier 20 and peaking amplifier 22. Carrier amplifier 20 is coupled via a matching network or circuit (not illustrated) to a first output of power splitter 12. Peaking amplifier 22 is coupled via a matching network or circuit (not illustrated) to a second output of power splitter 12. As will be appreciated by those of ordinary skill based on the description herein, the carrier and peaking amplifiers 20 and 22 may be comprised of one or more stages of relatively low power level amplification and relatively high power level amplification.

An impedance inverter or a λ/4 transmission line phase shift element 24 is connected between the output of carrier amplifier 20 and a summing or output node, and the output of the peaking amplifier 22 also is coupled to the summing node. The phase shift introduced by element 24 is, in some implementations, compensated by a 90 degree relative phase shift present on path 16 introduced by phase shift element 26.

An impedance network, including impedance 28, functions to present the proper load impedances to each of carrier amplifier 20 and peaking amplifier 22. An output load 30 (e.g., 50 ohms) is connected to the outputs of carrier amplifier 20 and peaking amplifier 22.

Amplifier 10 is configured so that the carrier amplifier 20 provides the amplification for lower level input signals, and both amplifiers 20 and 22 operate in combination to provide the amplification for high input level signals. In one implementation, the carrier amplifier 20 is configured to amplify a signal received from the main path 14, while the peaking amplifier 22 is configured to amplify a signal received from the peaking path 16 only when the input signal to the amplifier exceeds a predetermined threshold (transition point α).

This may be accomplished, for example, by biasing the carrier amplifier 20, such that the carrier amplifier 20 operates in a class AB mode, and biasing the peaking amplifier 22 such that the peaking amplifier 22 operates in a class C mode.

The Doherty amplifier 10 architecture depicted in FIG. 1 is widely used in communication systems due to the architecture's capability to deliver high efficiency over an extended input signal range. The architecture can also linearize well using Digital Pre-Distortion (DPD) techniques.

One difficulty in the design of Doherty amplifiers involves designing a system that supports constant carrier amplifier compression. Furthermore, it is important to properly match the amplitude and phase constituents of the signals presented to each of the carrier and peaking amplifiers such that the desired load modulation is achieved and the output signals of each of the carrier and peaking amplifiers combine as expected.

The present disclosure provides embodiments of a multi-path (e.g., two or more path) amplifier including an adjustable power splitter having an adjustable attenuator and phase shifter on each of the amplification paths (e.g., on each of the carrier and peaking paths) enabling the alignment and optimization of the radio frequency performance of each of the paths (e.g., both the carrier and peaking paths) of the amplifier. Because the performance of an amplifier can be affected by a number of variables, such as frequency of operation, temperature of the device, and output power of the amplifier, the present amplifier incorporates a phase and output power feedback loop enabling the device to automatically adjust the amplitudes and phases of the separate input signals being supplied to the paths (e.g., the carrier and peaking paths) of the amplifier.

In one implementation, the phase settings of the phase shifters on each of the paths (e.g., each of the carrier and peaking paths) are determined based upon measurements of the phase distortion at the output of each of the amplifiers (e.g., at the output of each of the carrier amplifier and the peaking amplifier) measured using phase detectors. Similarly the attenuation settings of the variable attenuators on each of the paths (e.g., each of the carrier and peaking paths) are determined based upon the power at the output of each of the amplifiers (e.g., each of the carrier amplifier and the peaking amplifier) measured using power detectors. The phase and power detectors can be implemented at the outputs of the amplifiers (e.g., at the output of the carrier amplifier and the output of peaking amplifier).

In this implementation, variations in amplitude (am/am) distortion and/or phase (am/pm) distortion characteristics of each amplifier (e.g., each of the carrier amplifier and the peaking amplifier) caused by power, temperature and/or frequency variations can be detected in real time or near-real time. Then, the measured variations can be fed back to a controller and used to determine attenuation and/or phase settings of the adjustable power splitter in order to compensate for those variations and provide improved amplifier performance by conditioning the input signals supplied to each amplifier.

Figure 2:
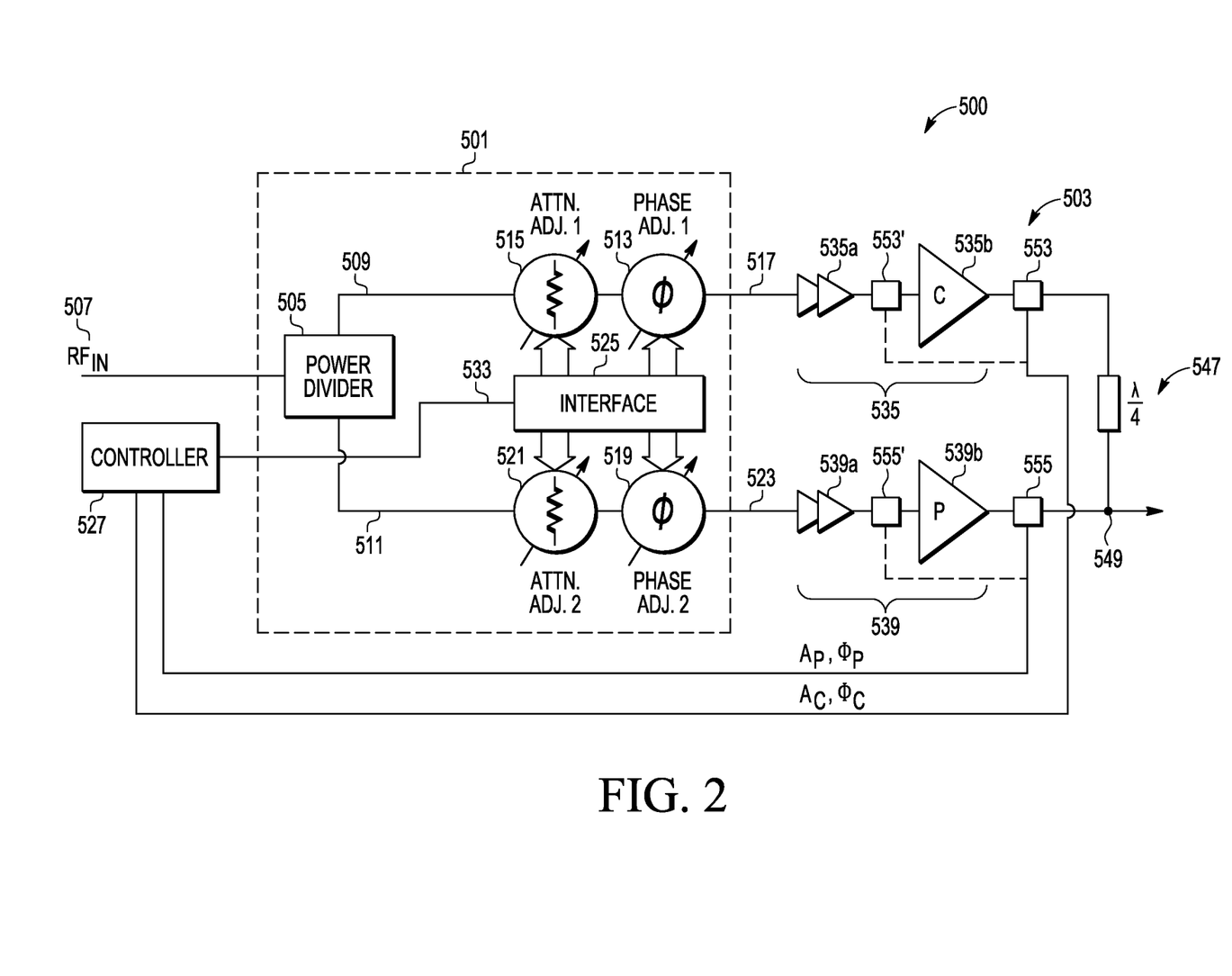
FIG. 2 shows a dual path amplifier having output power and phase shift detectors connected in a feedback loop to a controller.

FIG. 2 depicts dual path amplifier 500 having variable or adjustable components, such as variable attenuators and phase shifters, positioned on each path of the amplifier, in accordance with an embodiment. Amplifier 500 includes alignment module or power splitter 501. Power splitter 501 divides an input signal into multiple amplification paths, where each amplification path includes adjustable components, such as a variable attenuator (e.g., one of variable attenuators 515, 521), and an adjustable phase shifter (e.g., one of phase shifters 513, 519), and an amplifier (e.g., one of amplifiers 535, 539).

Power splitter 501 includes a power divider 505 with an input 507 for receiving an input radio frequency signal (RFIN), and first and second divider outputs 509 and 511, respectively. In a symmetrical Doherty amplifier, power divider 505 operates to divide or split an input signal received at input 507 into two signals that are very similar with, in some embodiments, equal power. This equal power form of power divider 505 may be referred to as a 3 decibel (dB) divider when the resultant signals are each 3 dB less than the signal at the input 507. While a 3 dB divider is typical, other dividers with multiple outputs or outputs with unequal signals could be fashioned and used in some applications.

Power splitter 501 includes first adjustable phase shifter 513 and first variable attenuator 515, which are coupled to the first divider output 509 and configured for providing a first power output 517. It will be appreciated that the adjustable phase shifter 513 and variable attenuator 515 can be series-coupled to each other in any order (e.g., variable attenuator 515 followed by phase shifter 513 as shown or vice versa). Power splitter 501 includes second adjustable phase shifter 519 and second variable attenuator 521, which are coupled to the second divider output 511 and configured for providing a second power output 523. As noted above, the order in which these components are series-coupled to each other can be changed.

In various embodiments of the adjustable power splitter 501, the first and second adjustable phase shifters 513 and 519 are each digitally controlled (e.g., using interface 525) and have a plurality of states resulting in various levels of phase shift. The first and second adjustable phase shifters 513 and 519, for example, may each have eight phase shifted states where each phase shifted state defines a particular phase shift in degrees. In one example, the phase shifted states can be separated by approximately 6.5 degrees. It will be appreciated that the first and second adjustable phase shifters 513 and 519 may have different phase shifted states, cover different ranges, and have different steps sizes from one another, although typically they will be essentially the same. While digitally controlled, the adjustable phase shifters in many embodiments are analog phase shifters.

In various embodiments of power splitter 501, the first and typically the second variable attenuator 515 and 521 are each digitally controlled (e.g., using interface 525) and have a plurality of attenuation levels where the attenuation levels are separated by a number of dB—in one example 0.5 dB separates the attenuation levels. The first and second variable attenuators 515 and 521 may each have, for example, eight attenuation states or attenuation levels, although they may have more or fewer attenuation states or attenuation levels, in other embodiments. It will be appreciated that the first and second variable attenuators 515 and 521 may have different attenuation states, cover different attenuation ranges, and have different attenuation steps sizes from one another, although typically they will be essentially the same. While digitally controlled, the adjustable attenuators in some embodiments can be analog attenuators.

Some embodiments of power splitter 501 may further include one or more optional fixed phase shifters (not illustrated) that is configured for adding a fixed phase shift between first and second signals at the, respectively, first and second power outputs 517 and 523. In some embodiments, this can be a fixed and predetermined phase shift (e.g., 90 degrees) added to one amplification path (e.g., the amplification path between output 509 and power output 517, or the amplification path between output 511 and power output 523).

In certain applications (e.g., within Doherty amplifier 503), a ninety degree phase shift is added to one path in the amplifier, and the fixed phase shift can be used to offset this amplifier phase shift. The fixed phase shift in some embodiments includes a phase shift in a negative or positive direction (e.g., a negative shift $\lambda/8$, such as a negative forty five degree shift) for the first signal at the first power output 517, and a phase shift in the opposite direction (e.g., a positive shift $\lambda/8$ such as a positive forty five degree phase shift) for the second signal at the second power output 523. Using the opposite-signed, forty five degree phase shifts yields a ninety degree relative phase shift between the signals at the power outputs 517 and 523. The phase shifter can be implemented as lumped element circuits having an inductive and a capacitive reactance.

Interface 525 can be configured and arranged for setting the adjustable phase shifters 513 and 519 and variable attenuators 515 and 521 of power splitter 501 in response to an input received at input 533. Using interface 525, controller 527 may be configured to adjust and modify power splitter 501 in accordance with the methods described in the present disclosure. Input 533 (or input/output) of interface 525 may include a data interface (e.g., a serial interface such as a serial peripheral interface (SPI), not illustrated). The data interface (e.g., the SPI) may be implemented on the same integrated circuit chip as power splitter 501 (e.g., a single silicon or gallium-arsenide chip), or the data interface and the power splitter 501 may be implemented on different integrated circuit chips (e.g., two silicon chips, two gallium-arsenide chips, or a combination of one silicon chip (e.g., for the SPI) and one gallium-arsenide chip (e.g., for the power splitter 501)).

Generally, the attenuators 515 and 521 and/or phase shifters 513 and 519 are controlled using a number of switches, typically solid state or integrated switches such as those implemented as transistors. Thus, interface 525 can be provided state information for all switches in all attenuators 515 and 521 and phase shifters 513 and 519, and the interface 525 acts as one or more latching buffers with outputs arranged and coupled to ensure that all switches are in the appropriate ON or OFF state. Alternatively, interface 525 can be provided an encoded value (e.g., a binary value) or two or more encoded values, wherein each of the encoded values uniquely specify a state for each attenuator 515 and 521 and phase shifter 513 and 519. For example, if phase shifters 513 and 519 and attenuators 515 and 521 are 8 state devices, a 3 bit encoded value for each could be used to uniquely specify a particular state. Accordingly, during operation, 4 such encoded values could be provided to interface 525 (e.g., one for each attenuator 515 and 521, and one for each phase shifter 513 and 519). Interface 525 may then convert each encoded value to the appropriate control signals (e.g., switch control signals) for each attenuator 515 and 521 and phase shifter 513 and 519, and latch in these values. In other embodiments, the amount of phase shift and attenuation for each of the four devices 513, 515, 519, and 521 could be sent to interface 525, and the interface 525 could determine the proper state to realize the desired shifts and attenuations. In another alternate embodiment, the interface 525 may receive an address or offset, and may look up the phase state and/or attenuator state information in a lookup table (not illustrated) based on the received address or offset.

Doherty amplifier 503 of amplifier 500 includes main or carrier amplifier 535 coupled via a matching network or circuit (not illustrated) to the first power output 517 and a peaking amplifier 539 coupled via a matching network or circuit (not illustrated) to the second power output 523. As will be appreciated by those of ordinary skill based on the description herein, the main and peaking amplifiers 535 and 539 may be comprised of one or more stages of relatively low power level amplification and relatively high power level amplification. For example, carrier amplifier 535 may include a first stage that includes one or more low power level amplifiers 535*a* and a second or final stage 535*b* that includes a high power level amplifier. Similarly, peaking amplifier 539 may include a first stage that includes one or more low power level amplifiers 539*a* and a second or final stage 539*b* that includes a high power level amplifier.

The carrier and peaking amplifiers 535, 539 are coupled via respective output matching circuits (not illustrated) to a Doherty combiner 547, and output node 549. Doherty combiner 547, which is configured such that the carrier amplifier 535 provides the amplification for lower level signals, and both amplifiers 535, 539 operate in combination to provide the amplification for high level signals when the input signal exceeds transition point α. This may be accomplished, for example, by biasing the carrier amplifier 535, such that it operates in a class AB mode, and biasing the peaking amplifier 539 such that it operates in a class C mode. In an embodiment, an impedance inverter or $\lambda/4$ line phase shift element 547 is connected between the output of carrier amplifier 535 and the summing node 549. In an alternate embodiment, amplifier 500 may have an "inverted Doherty" configuration. In such a configuration, the impedance inverter or λ/4 line phase shift element 547 is connected between the output of peaking amplifier 539 and the summing node 549, rather than being connected between the output of carrier amplifier 535 and the summing node 549.

More complex implementations of amplifier 500 are possible in which power splitter 501 has three or more outputs, and the Doherty amplifier 503 has a single carrier amplifier and two or more peaking amplifiers, for example, with each peaking amplifier biased in different class C operating points. In such an embodiment, the power splitter 501 may include three or more paths, with each including an adjustable phase shifter and an adjustable attenuator.

In an embodiment of the present system, the variable attenuators 515 and 521 and phase shifters 513 and 519 are manipulated by controller 527 to shape the signal being inputted into one or more of the amplifiers (e.g., carrier amplifier 535 and/or peaking amplifier 539) to provide an improved or desired response of amplifier 500.

To assist controller 527 in shaping the input signals to each of carrier amplifier 535 and peaking amplifier 539, amplifier 500 includes phase and power detectors 553 and 555 coupled to the carrier path and the peaking path, respectively. Detectors 553 and 555 are configured to measure signal characteristics of the amplifier, such as the phase shift and/or distortion and output power of carrier amplifier 535 and peaking amplifier 539, respectively. In measuring the output power, detectors 553 and 555 may be configured to measure the magnitude of the envelope of the output signal (e.g., the peak envelope voltage, the average envelope voltage, the peak envelope power, the average envelope power, or some other power or voltage measurement with respect to the signal) outputted by carrier amplifier 535 and peaking amplifier 539, respectively.

In FIG. 2, detectors 553 and 555 are depicted as being single components that are connected to amplifier 500. In other implementations, though, each one of detectors 553 and 555 may be implemented as a number of separate components, where one component or set of components is configured to detect phase shift, while another component or set of components is configured to detect output power. Detectors 553 and 555 may be implemented using application-specific integrated circuits, for example. The detectors 553 and 555 are configured to sample the output amplitude and phase shift or distortion on each path of the amplifier at a frequency that is at least that of the input signal, if not higher. Generally, the detectors 553 and 555 exhibit low losses and have a sufficient dynamic range and frequency response to accurately measure both the output power and phase shift.

Detectors 553 and 555 are coupled to controller 527, enabling controller 527 to receive a data signal from detectors 553 and 555 and thereby monitor the phase shift and output power of each path of amplifier 500. By monitoring this output, controller 527 can then manipulate variable attenuators 515 and 521 and adjustable phase shifters 513 and 519 to shape the signal being inputted to each one of carrier amplifier 535 and peaking amplifier 539 in order to achieve a desired amplifier 500 output.

This adaptive adjustment of amplitude and phase of power splitter 501 can modify amplifier 500 operation to more closely match a desired response. In general, controller 527 may be configured to optimize amplifier 500 performance to achieve maximum peak power, improve linearity, or maximize efficiency, though controller 527 may be configured to optimize amplifier 500 to achieve other desired performance characteristics, as well.

Because there are a large number of uncontrollable factors that may cause amplifier 500 to deviate from its desired operation (e.g., device-to-device variations (including variation in gain, AM/PM, bias, etc.), passive component-to-component variations (e.g., variations in capacitance and inductance in passive components), variations in printed circuit board (PCB) material, performance changes with temperature, and the like), detectors 553 and 555 operate as feedback devices enabling controller 527 to monitor the operation of amplifier 500 and manipulate variable attenuators 515 and 521 and adjustable phase shifters 513 and 519 to offset those factors and return amplifier 500 to its desired operation.

Generally, controller 527 is configured to use detectors 553 and 555 to monitor signal characteristics, such as the phase shift ($\phi_C$) and output power ($A_C$), of carrier amplifier 535 and the phase shift ($\phi_P$) and output power ($A_P$) of peaking amplifier 539, respectively, to detect deviations from a desired amplifier 500 operation. As controller 527 detects deviations from the desired operation, controller 527 modifies the states of one or more of the variable attenuators 515 and 521 and the adjustable phase shifters 513 and 519 to modify the signals being inputted into carrier amplifier 535 and/or peaking amplifier 539 to compensate for those deviations. The deviations, as discussed above, can arise from a large number of factors that cannot easily be anticipated or accounted for in the overall design of amplifier 500.

For example, if the desired operation of amplifier 500 calls for a particular phase shift between the outputs of carrier amplifier 535 and peaking amplifier 539 (e.g., a phase shift of 90 degrees), but controller 527 detects a different phase shift based on the feedback signals from detectors 553 and 555, controller 527 can adjust one or more of adjustable phase shifters 513 and 519 to achieve the desired output of the amplifier. Similarly, if controller 527 detects that the output power of one or more of carrier amplifier 535 and peaking amplifier 539 deviates from desired value based on the feedback signals from detectors 553 and 555, controller 527 can adjust one or more of variable attenuators 515 and 521 to achieve the desired output power.

To optimize amplifier 500 for output power, for example, power splitter 501 can be adjusted by controller 527 so that the output signals of carrier amplifier 535 and peaking amplifier 539 are equal in power when they arrive at output node 549. Additionally, power splitter 501 can be adjusted so that the output signals of carrier amplifier 535 and peaking amplifier 539 have the same phase when they arrive at output node 549, thereby providing for more optimal signal combining.

To optimize amplifier 500 for output efficiency, power splitter 501 is adjusted so that the output power of carrier amplifier 535 is higher in amplitude compared to the output power of peaking amplifier 539, in an embodiment. This may involve adjusting phase shifters 513 and 519 so that $\phi c = \phi p + \phi offset$, where $\phi offset$ may be adjusted from the nominal 90 degrees of phase to obtain improved signal combining at node 549. Additionally, $A_P$ is reduced, for example, by manipulating variable attenuator 521 to achieve maximum efficiency, which may result in an overall reduction in peak power for amplifier 500.

To optimize amplifier 500 for linearity, power splitter 501 is adjusted so that the output signal of peaking amplifier 539 is higher in amplitude compared to the output signal of carrier amplifier 535, in an embodiment. This may involve adjusting power splitter 501 (and, specifically, adjustable phase shifters 513 and 519) so that $\phi c = \phi p + \phi offset$, where $\phi offset$ may be adjusted from the nominal 90 degrees of phase to obtain improved signal combining at node 549. Additionally, $A_C$ is reduced, for example, by manipulating variable attenuator 521 to achieve optimum linearity, which may result in an overall increase in peak power for amplifier 500.

In some cases, amplifier 500 may be optimized in a manner that provides a trade off between linearity and efficiency. This may involve adjusting power splitter 501 (and, specifically, adjustable phase shifters 513 and 519) so that $\phi c = \phi p + \phi offset$, where $\phi offset$ may be approximately but not necessarily exactly 90 degrees. Additionally, variable attenuators 515 and 521 may be adjusted so that $A_C$ is equal to $A_P$ when the peaking amplifier is conducting.

Although illustrated in FIG. 2 as being connected to the outputs of the final stages of carrier amplifier 535 and peaking amplifier 539, detectors 553 and 555 may, in fact, be connected to amplifier 500 in other manners that allow for the measurement of a phase distortion and an output power of one or more paths of amplifier 500.

Accordingly, in some implementations, detectors 553 and 555 may instead be connected to amplifier 500 in an alternative configuration. For example, where carrier amplifier 535 and/or peaking amplifier 539 includes multiple stages (e.g., driver stages 535a and 539a and final stages 535b and 539b), detectors 553 and 555 may be connected to the outputs of any of the driver stages or final stages in order to measure phase shift and output power.

With reference to FIG. 2, for example, detector 553 may be connected between driver stage 535a and final stage 535b of carrier amplifier 535 (see, for example, detector 553') and detector 555 may be connected between driver stage 539a and final stage 539b of peaking amplifier 539 (see, for example, detector 555'). In such a configuration, detectors 553 and 555 may be limited to detecting the phase shift and output power of the driver stages 535a and 539a of carrier amplifier 535 and peaking amplifier 539. Accordingly, detectors 553 and 555 may not be able to measure any phase distortion or the output power of the final stages 535b and 539b of carrier amplifier 535 and peaking amplifier 539. In that case, controller 527 may estimate the output power and phase shift of carrier amplifier 535 and peaking amplifier 539. This may involve, for example, receiving the output power and phase shift measurements from detectors 553 and 555 and then modifying those values based upon an anticipated phase shift and output power of the final stages 535b and 539b of carrier amplifier 535 and peaking amplifier 539. The anticipated phase shift and output power may be based upon anticipated operation of the carrier amplifier 535 and peaking amplifier 539 in view of the amplifier's design and methods of manufacture.

During design of amplifier 500, for example, some of the potential variances in the manufacture of amplifiers 535 and 539 can be simulated, and the adjustments in attenuation and phase to yield optimal efficiency, or power output, or a trade-off between power and efficiency can be determined using those simulations. Similarly, a sample of production units (i.e., of amplifiers 535 and 539) can be analyzed or tested to measure actual production variations in the amplifiers. Using those measurements, the amount of attenuation and phase adjustments provided by controller 527 to achieve optimal performance can be determined empirically for the sampled devices. This information can then be used as part of an algorithm for controller 527 to provide optimized amplifier 500 performance.

In this configuration, although detectors 553 and 555 may only be able to measure the phase shift and output power of the first stages 535a and 539a of carrier amplifier 535 and peaking amplifier 539, the detectors 553 and 555 can measure lower signal levels, potentially simplifying the configuration of detectors 553 and 555 and reducing their power consumption.

In various other embodiments, detectors 553 and 555 may be connected at any of various other points along each of the carrier path and peaking path of amplifier 500. Both a phase shift detector and an output power detector may be configured to measure signals at the same node or point along a path, or the phase shift and output power of signals carried on a particular path may be measured at different points along the path. For example, output power may be measured at the outputs of the final stages 535b and 539b of carrier amplifier 535 and peaking amplifier 539, while the phase shifts may be measured at the outputs of the first stages 535a and 539a of carrier amplifier 535 and peaking amplifier 539. Additionally, the configurations of detectors 553 and 555 need not be symmetrical, so that detectors 553 and 555 (and the output power detectors and phase shift detectors of each) may be connected at different points of their respective paths. In some implementations, where an amplifier has N-paths, less then N detectors may be used, so that phase and/or output power measurements are not made for one or more of the amplifier's paths.

Figure 3A:
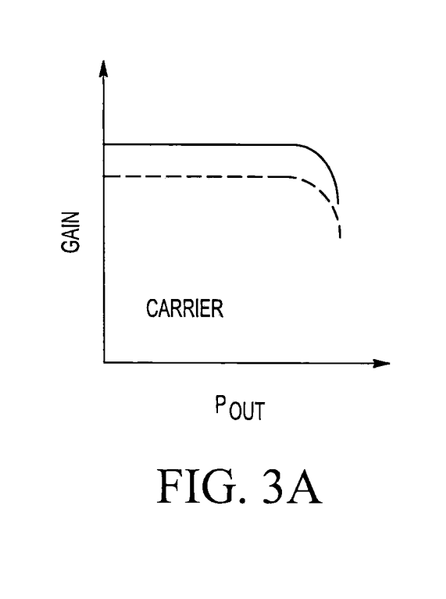
FIGS. 3A and 3B are graphs illustrating the gain response of a carrier amplifier and a peaking amplifier, respectively, in an example amplifier.
Figure 3B:
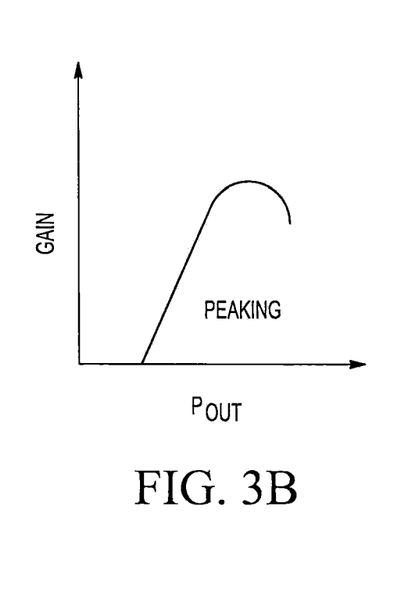
Figure 3C:
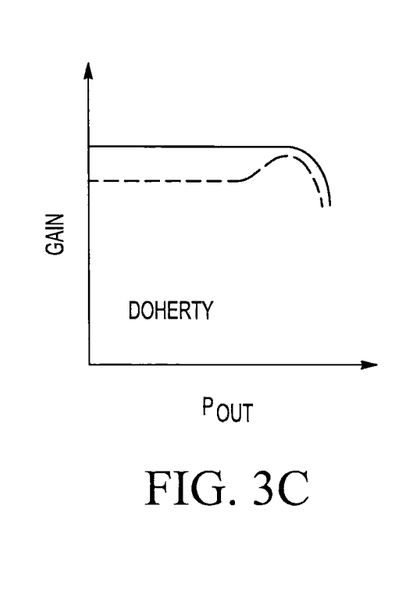
FIG. 3C is a graph illustrating the gain output of an amplifier.

FIGS. 3A and 3B are graphs illustrating the gain response of a carrier amplifier and a peaking amplifier, respectively, in an example embodiment of an amplifier. FIG. 3C shows the gain response of the amplifier embodiment after the outputs of the carrier amplifier and peaking amplifier have been combined at an output node. The vertical axis of each graph represents gain, while the horizontal axis represents output power ($P_{out}$). Solid lines represent the desired responses.

With reference to FIG. 3A, the carrier amplifier's actual gain (indicated by the dashed line) is depicted to be less than the desired gain (indicated by the solid line). This deficiency could be attributable to many factors, such as environmental factors or manufacturing deficiencies in the carrier amplifier. The reduction in gain of the carrier amplifier is reflected in the output of the entire amplifier, which, as illustrated by the dashed line in FIG. 3C, is similarly reduced.

In accordance with an embodiment, therefore, a controller monitoring the output power of the carrier amplifier (e.g., controller 527 of FIG. 2) could detect the reduction in output of the carrier amplifier and modify the amplifier's power splitter to compensate, potentially by adjusting one or more of a variable attenuator and adjustable phase shifter in the carrier path of the amplifier. This may shift the output of the entire amplifier closer to the idealized output, as indicated by the solid line illustrated in FIG. 3C.

Various methods and systems have been described with reference to a dual-path Doherty amplifier device. These approaches, though, can be generalized to multiple-path amplifiers having three or more amplifier paths. In that case, suitable phase shift detectors and output power detectors can be connected to each path of the amplifier. The detectors, as described above, can be configured to detect the phase shift and output power of the amplifiers on each path. The data captured by the detectors can then be supplied to a controller that is configured to adjust the attenuation and phase shift of each path of the amplifier. Using the data captured by the detectors, therefore, the controller is configured to adjust the attenuation and phase shift of each path of the amplifier in order to achieve a more desired operation of the amplifier. As such, the present disclosure can be generalized to a multi-path amplifier having N amplifiers, and a corresponding number of phase shift and output power detectors.

An embodiment of a device includes a power splitter configured to couple to an amplifier having a first path and a second path, a first adjustable attenuator and a first adjustable phase shifter connected to the first path of the amplifier, and a second adjustable attenuator and a second adjustable phase shifter connected to the second path of the amplifier. The device includes a controller coupled to the first and second variable attenuators and the first and second adjustable phase shifters. The controller is configured to monitor a phase shift and an output power of each of the first path and second path of the amplifier, and adjust at least one of the first and second variable attenuators and the first and second adjustable phase shifters based upon the phase shift and the output power of each of the first path and second path of the amplifier to modify an input signal to the first path or the second path of the amplifier.

An embodiment of a device includes a controller configured to couple to an amplifier having a first path and a second path. The controller is configured to monitor one or more signal characteristics selected from a phase shift and an output power of at least one of the first path and second path of the amplifier, and adjust operation of one or more adjustable components selected from a first variable attenuator coupled to the first path, a first adjustable phase shifter coupled to the first path, a second variable attenuator coupled to the second path, and a second adjustable phase shifter coupled to the second path based on the monitored one or more signal characteristics to modify input signals to either or both the first path or the second path of the amplifier.

An embodiment of a method includes monitoring one or more signal characteristics selected from a phase shift and an output power of either or both of a first path and a second path of an amplifier, and adjusting operation of one or more adjustable components selected from a first variable attenuator coupled to the first path, a first adjustable phase shifter coupled to the first path, a second variable attenuator coupled to the second path, and a second adjustable phase shifter coupled to the second path based on the monitored one or more signal characteristics.

An embodiment of a device includes a power splitter configured to couple to an amplifier having a first path and a second path, one or more first adjustable components connected to the first path of the amplifier, and one or more second adjustable components connected to the second path of the amplifier. The device includes a controller coupled to the one or more first and second adjustable components. The controller is configured to monitor one or more signal characteristics selected from a phase shift and an output power of signals carried on either or both of the first path and second path of the amplifier, and adjust at least one of the one or more first and second adjustable components based upon the monitored one or more signal characteristics to modify an input signal to either or both the first path or the second path of the amplifier.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device, comprising:
   a power splitter configured to couple to an amplifier having a first path and a second path;
   a first adjustable attenuator and a first adjustable phase shifter connected to the first path of the amplifier;
   a second adjustable attenuator and a second adjustable phase shifter connected to the second path of the amplifier;
   a controller coupled to the first and second variable attenuators and the first and second adjustable phase shifters, the controller being configured to:
      monitor a phase shift and an output power of each of the first path and second path of the amplifier; and
      adjust at least one of the first and second variable attenuators and the first and second adjustable phase shifters based upon the phase shift and the output power of each of the first path and second path of the amplifier to modify an input signal to the first path or the second path of the amplifier.

2. The device of claim 1, wherein the amplifier includes a Doherty amplifier.

3. The device of claim 2, wherein the amplifier includes:
   a peaking amplifier coupled to the second path of the amplifier;
   a first phase shift detector coupled to the peaking amplifier and the controller; and
   a first output power detector coupled to the peaking amplifier and the controller.

4. The device of claim 3, wherein the peaking amplifier includes a first stage and a second stage, and at least one of the first phase shift detector and the first output power detector are coupled between the first stage and the second stage of the peaking amplifier.

5. The device of claim 3, wherein the amplifier includes:
   a carrier amplifier coupled to the first path of the amplifier;
   a second phase shift detector coupled to the carrier amplifier and the controller; and
   a second output power detector coupled to the carrier amplifier and the controller.

6. The device of claim 5, wherein the carrier amplifier includes a first stage and a second stage, and at least one of the second phase shift detector and the second output power detector are coupled between the first stage and the second stage of the carrier amplifier.

7. The device of claim 1, wherein the controller is configured to modify an input signal to the first path or the second path of the amplifier to optimize at least one of an output power of the amplifier, linearity of the amplifier, and efficiency of the amplifier.

8. A device, comprising:
   a controller configured to couple to an amplifier having a first path and a second path, the controller being configured to:
      monitor two or more signal characteristics selected from a phase shift and an output power of at least one of the first path and second path of the amplifier; and
      adjust operation one or more adjustable components selected from a first variable attenuator coupled to the first path, a first adjustable phase shifter coupled to the first path, a second variable attenuator coupled to the second path, and a second adjustable phase shifter coupled to the second path based on the monitored two or more signal characteristics to modify input signals to either or both the first path or the second path of the amplifier.

9. The device of claim 8, wherein the amplifier includes a Doherty amplifier.

10. The device of claim 9, wherein the amplifier includes:
a peaking amplifier coupled to the second path of the amplifier;
a first phase shift detector coupled to the peaking amplifier and the controller; and
a first output power detector coupled to the peaking amplifier and the controller.

11. The device of claim 10, wherein the peaking amplifier includes a first stage and a second stage, and at least one of the first phase shift detector and the first output power detector are coupled between the first stage and the second stage of the peaking amplifier.

12. The device of claim 10, wherein the amplifier includes:
a carrier amplifier coupled to the first path of the amplifier;
a second phase shift detector coupled to the carrier amplifier and the controller; and
a second output power detector coupled to the carrier amplifier and the controller.

13. The device of claim 12, wherein the carrier amplifier includes a first stage and a second stage, and at least one of the second phase shift detector and the second output power detector are coupled between the first stage and the second stage of the carrier amplifier.

14. The device of claim 8, wherein the controller is configured to modify an input signal to the first path or the second path of the amplifier to optimize at least one of an output power of the amplifier, linearity of the amplifier, and efficiency of the amplifier.

15. A method, comprising:
monitoring one or more signal characteristics selected from a phase shift and an output power of each of a first path and a second path of an amplifier, the first path and the second path carrying radio frequency signals; and
adjusting operation of one or more adjustable components selected from a first variable attenuator coupled to the first path, a first adjustable phase shifter coupled to the first path, a second variable attenuator coupled to the second path, and a second adjustable phase shifter coupled to the second path based on the monitored one or more signal characteristics to make the output power of the first path substantially equal to the output power of the second path.

16. The method of claim 15, wherein adjusting operation of the one or more adjustable components includes modifying an input signal to the first path or the second path of the amplifier to optimize at least one of an output power of the amplifier, a linearity of the amplifier, and an efficiency of the amplifier.

17. The method of claim 15, including adjusting operation of the one or more adjustable components to set a difference between the phase shift of the first path and the phase shift of the second path to a target phase shift value.

18. The method of claim 17, wherein the target phase shift value is substantially equal to 90 degrees.

19. The method of claim 15, including adjusting operation of the one or more adjustable components to make the output power of the first path greater than the output power of the second path.

20. A device, comprising:
a power splitter configured to couple to an amplifier having a first path and a second path, the first and second path being connected at an output node;
one or more first adjustable components connected to the first path of the amplifier;
one or more second adjustable components connected to the second path of the amplifier;
a controller coupled to the one or more first and second adjustable components, the controller being configured to:
monitor one or more signal characteristics selected from a phase shift and an output power of radio frequency signals carried on either or both of the first path and second path of the amplifier using a detector connected between output node and the one or more first adjustable components or the one or more second adjustable components; and
adjust at least one of the one or more first and second adjustable components based upon the monitored one or more signal characteristics to modify an input signal to either or both the first path or the second path of the amplifier.

* * * * *